United States Patent
Song et al.

(10) Patent No.: US 11,870,880 B2
(45) Date of Patent: Jan. 9, 2024

(54) CLOCK DATA RECOVERY (CDR) WITH MULTIPLE PROPORTIONAL PATH CONTROLS

(71) Applicant: Samsung Display Co., Ltd., Yongin-si (KR)

(72) Inventors: Younghoon Song, Santa Clara, CA (US); Anup P. Jose, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

(21) Appl. No.: 17/714,104

(22) Filed: Apr. 5, 2022

(65) Prior Publication Data

US 2023/0246800 A1 Aug. 3, 2023

Related U.S. Application Data

(60) Provisional application No. 63/305,153, filed on Jan. 31, 2022.

(51) Int. Cl.
*H04L 7/00* (2006.01)
*H03L 7/08* (2006.01)
(Continued)

(52) U.S. Cl.
CPC ............ *H04L 7/0016* (2013.01); *H03L 7/085* (2013.01); *H03L 7/0807* (2013.01); *H03L 7/099* (2013.01); *H03M 1/66* (2013.01)

(58) Field of Classification Search
CPC ....... H04L 7/0807; H04L 7/085; H04L 7/099; H04L 7/087; H04L 7/089; H04L 7/0016;
(Continued)

(56) References Cited

U.S. PATENT DOCUMENTS 5,502,499 A * 3/1996 Birch ................... H04N 21/242
    348/521
5,588,027 A * 12/1996 Lim .................... H04L 27/2332
    375/330
(Continued)

FOREIGN PATENT DOCUMENTS

WO    2012/061631 A1    5/2012

OTHER PUBLICATIONS

Hanumolu, Pavan Kumar, et al., "A 1.6Gbps Digital Clock and Data Recovery Circuit," IEEE 2006 Custom Integrated Circuits Conference (CICC), IEEE, 2006, pp. 603-606.
(Continued)

*Primary Examiner* — James M Perez
(74) *Attorney, Agent, or Firm* — Lewis Roca Rothgerber Christie LLP

(57) ABSTRACT

A digital clock data recovery circuit including: a first vote circuit connected at an output of a first deserializer and configured to generate an even up/down signal based on even deserialized signals from the first deserializer; a first digital to analog converter (DAC) connected at an output of the first vote circuit and configured to control a voltage and/or frequency of a voltage controlled oscillator (VCO) based on the even up/down signal from the first vote circuit; a second vote circuit connected at an output of a second deserializer and configured to generate an odd up/down signal based on odd deserialized signals from the second deserializer; and a second DAC connected at an output of the second vote circuit and configured to control the voltage and/or frequency of the VCO based on the odd up/down signal from the second vote circuit.

20 Claims, 7 Drawing Sheets

(51) Int. Cl.
*H03L 7/085* (2006.01)
*H03L 7/099* (2006.01)
*H03M 1/66* (2006.01)

(58) Field of Classification Search
CPC ..... H04L 7/095; H04L 7/0891; H04L 7/0893; H04L 7/0895; H04L 7/0896; H04L 7/0898; H03M 1/66; H03L 7/0807; H03L 7/085; H03L 7/099; H03L 7/087; H03L 7/089; H03L 7/0891; H03L 7/0893; H03L 7/0895; H03L 7/0896; H03L 7/0898; H03L 7/095
See application file for complete search history.

(56) References Cited

U.S. PATENT DOCUMENTS

| | | | | |
|---|---|---|---|---|
| 6,307,906 B1* | 10/2001 | Tanji | H04L 25/14 | 375/376 |
| 6,684,033 B1* | 1/2004 | Doh | H04B 10/6931 | 375/225 |
| 6,977,959 B2* | 12/2005 | Brunn | H03L 7/113 | 375/376 |
| 7,099,424 B1* | 8/2006 | Chang | H03L 7/0814 | 327/284 |
| 7,102,446 B1* | 9/2006 | Lee | H03L 7/093 | 331/DIG. 2 |
| 7,366,267 B1* | 4/2008 | Lee | H04L 7/0008 | 375/364 |
| 8,036,333 B2* | 10/2011 | Jeon | H04L 7/10 | 375/374 |
| 8,437,216 B2* | 5/2013 | Oh | G11C 7/22 | 365/201 |
| 8,687,738 B1 | 4/2014 | Lee et al. | | |
| 9,014,322 B2* | 4/2015 | Nguyen | H03L 7/093 | 375/376 |
| 9,184,909 B1* | 11/2015 | McCracken | H04L 7/042 | |
| 9,356,767 B1* | 5/2016 | Ilhan | H04L 7/0025 | |
| 9,432,176 B2* | 8/2016 | Yu | H04L 7/033 | |
| 9,467,153 B2* | 10/2016 | Nguyen | H04L 7/033 | |
| 9,917,607 B1* | 3/2018 | Zhang | H04L 25/085 | |
| 10,033,519 B2* | 7/2018 | Duan | H04L 7/0012 | |
| 10,141,949 B1 | 11/2018 | Spaeth | | |
| 10,236,892 B2* | 3/2019 | Moballegh | H03L 7/087 | |
| 10,256,967 B2* | 4/2019 | Huang | H04L 7/0016 | |
| 10,305,495 B2* | 5/2019 | Behel | H03L 7/06 | |
| 10,347,283 B2* | 7/2019 | Hormati | H03L 7/093 | |
| 10,348,480 B2* | 7/2019 | Hossain | H04L 7/0025 | |
| 10,411,593 B1* | 9/2019 | Abramzon | H03K 21/08 | |
| 10,466,301 B1* | 11/2019 | Lee | G01R 31/3171 | |
| 10,630,461 B2* | 4/2020 | Abramzon | H04L 7/046 | |
| 10,644,716 B1* | 5/2020 | Luo | H03M 1/68 | |
| 10,686,583 B2* | 6/2020 | Ulrich | H04L 25/49 | |
| 10,735,177 B2* | 8/2020 | Ogata | H04B 10/50 | |
| 10,809,297 B2* | 10/2020 | Lee | G01R 31/31703 | |
| 10,848,171 B1* | 11/2020 | Carey | H03K 19/017509 | |
| 11,031,939 B1* | 6/2021 | Wolkovitz | H03L 7/0802 | |
| 11,038,602 B1* | 6/2021 | Sun | H04B 17/14 | |
| 11,251,934 B2* | 2/2022 | Ulrich | H04L 25/03 | |
| 11,404,102 B2* | 8/2022 | Lee | G11C 7/106 | |
| 11,469,877 B1* | 10/2022 | Raj | H04L 25/4917 | |
| 11,563,554 B2* | 1/2023 | Ulrich | H04L 25/4904 | |
| 11,588,487 B1* | 2/2023 | Goyal | H03L 7/0812 | |
| 11,695,539 B1* | 7/2023 | Modi | H04L 7/048 | 375/376 |
| 2004/0105516 A1* | 6/2004 | Smith | H03L 7/191 | 375/354 |
| 2004/0161068 A1* | 8/2004 | Zerbe | H04L 7/033 | 375/355 |
| 2005/0058234 A1* | 3/2005 | Stojanovic | H04L 7/0331 | 375/371 |
| 2006/0224339 A1* | 10/2006 | Kim | H04L 7/0083 | 702/66 |
| 2008/0123454 A1* | 5/2008 | Bae | G11C 7/222 | 365/206 |
| 2009/0002082 A1* | 1/2009 | Menolfi | H03L 7/0995 | 331/57 |
| 2010/0295586 A1* | 11/2010 | Weiner | H03L 7/093 | 327/157 |
| 2013/0070835 A1* | 3/2013 | Sindalovsky | H03L 7/093 | 375/238 |
| 2013/0315349 A1* | 11/2013 | Nguyen | H04L 7/033 | 375/340 |
| 2014/0241442 A1* | 8/2014 | Ahmadi | H03L 7/0996 | 375/259 |
| 2015/0103961 A1* | 4/2015 | Malipatil | H04B 1/10 | 375/355 |
| 2015/0280956 A1* | 10/2015 | Bogdan | H03L 7/08 | 375/376 |
| 2016/0013800 A1* | 1/2016 | Nguyen | H04L 7/033 | 327/159 |
| 2016/0080178 A1* | 3/2016 | Chen | H03L 7/089 | 375/233 |
| 2018/0152284 A1* | 5/2018 | Hossain | H04L 7/0337 | |
| 2018/0198597 A1* | 7/2018 | Huang | H03L 7/0807 | |
| 2018/0224885 A1* | 8/2018 | Liang | H03L 7/0814 | |
| 2019/0013927 A1* | 1/2019 | Ulrich | H04L 25/14 | |
| 2019/0130942 A1* | 5/2019 | Hormati | H03L 7/099 | |
| 2019/0280591 A1* | 9/2019 | Abramzon | H02M 3/07 | |
| 2019/0377378 A1* | 12/2019 | Gharibdoust | G06F 1/10 | |
| 2020/0313841 A1* | 10/2020 | Ulrich | H04L 25/4904 | |
| 2020/0321967 A1* | 10/2020 | Tajalli | H03L 7/0995 | |
| 2021/0119633 A1* | 4/2021 | Chattopadhyay | H03L 7/0807 | |
| 2022/0173883 A1* | 6/2022 | Ulrich | H04L 7/033 | |
| 2022/0278608 A1* | 9/2022 | Carden | H02M 1/40 | |
| 2023/0132188 A1* | 4/2023 | Lin | H03L 7/091 | 348/625 |
| 2023/0138296 A1* | 5/2023 | Lee | H03L 7/16 | 375/362 |
| 2023/0163940 A1* | 5/2023 | Ulrich | H04L 7/0054 | 375/226 |
| 2023/0246800 A1* | 8/2023 | Song | H04L 7/033 | 375/354 |

OTHER PUBLICATIONS

Kim, Dongwook, et al., "A 15-GB/s Sub-Baud-Rate Digital CDR," IEEE Journal of Solid-State Circuits, IEEE, vol. 54, No. 3, Mar. 2019, pp. 685-695.

EPO Extended European Search Report dated Jul. 12, 2023, issued in corresponding European Patent Application No. 23152479.4 (11 pages).

* cited by examiner

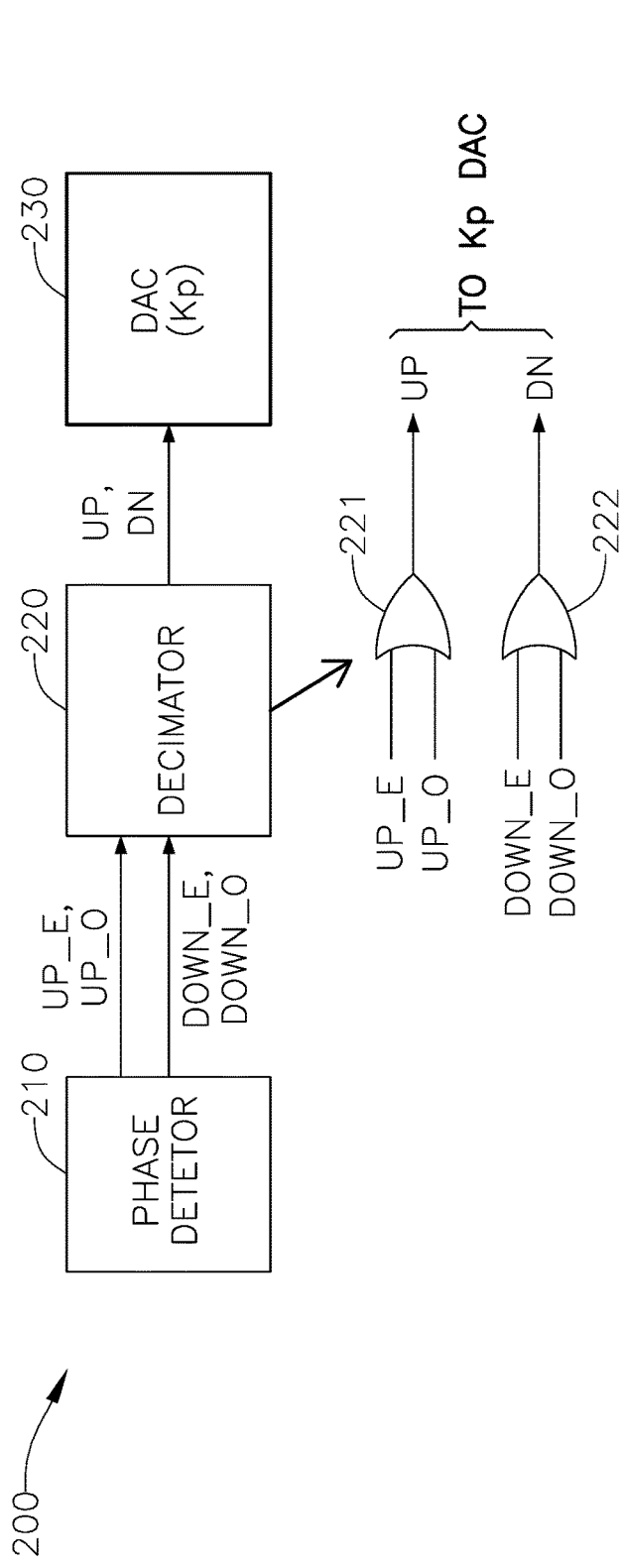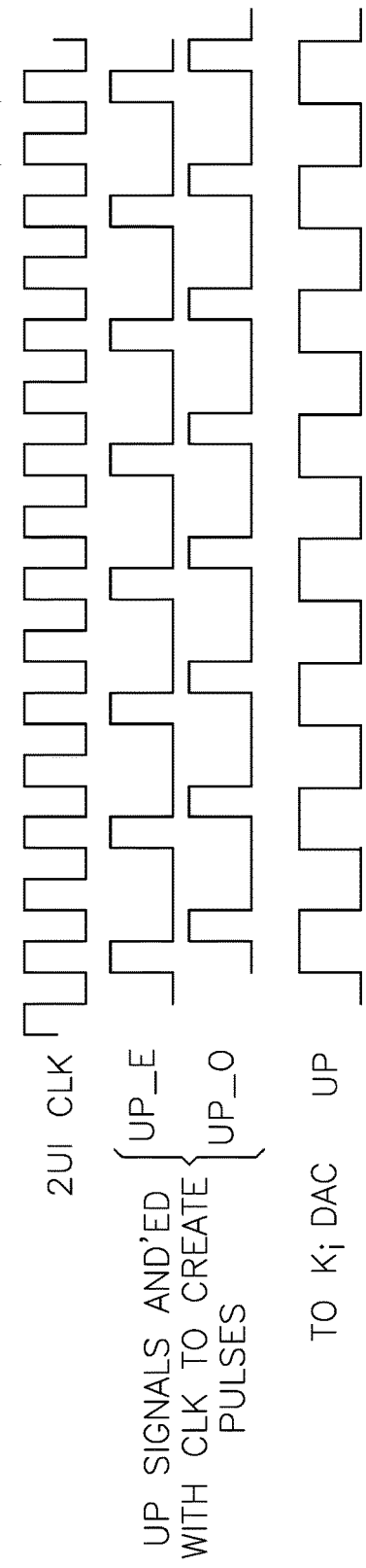

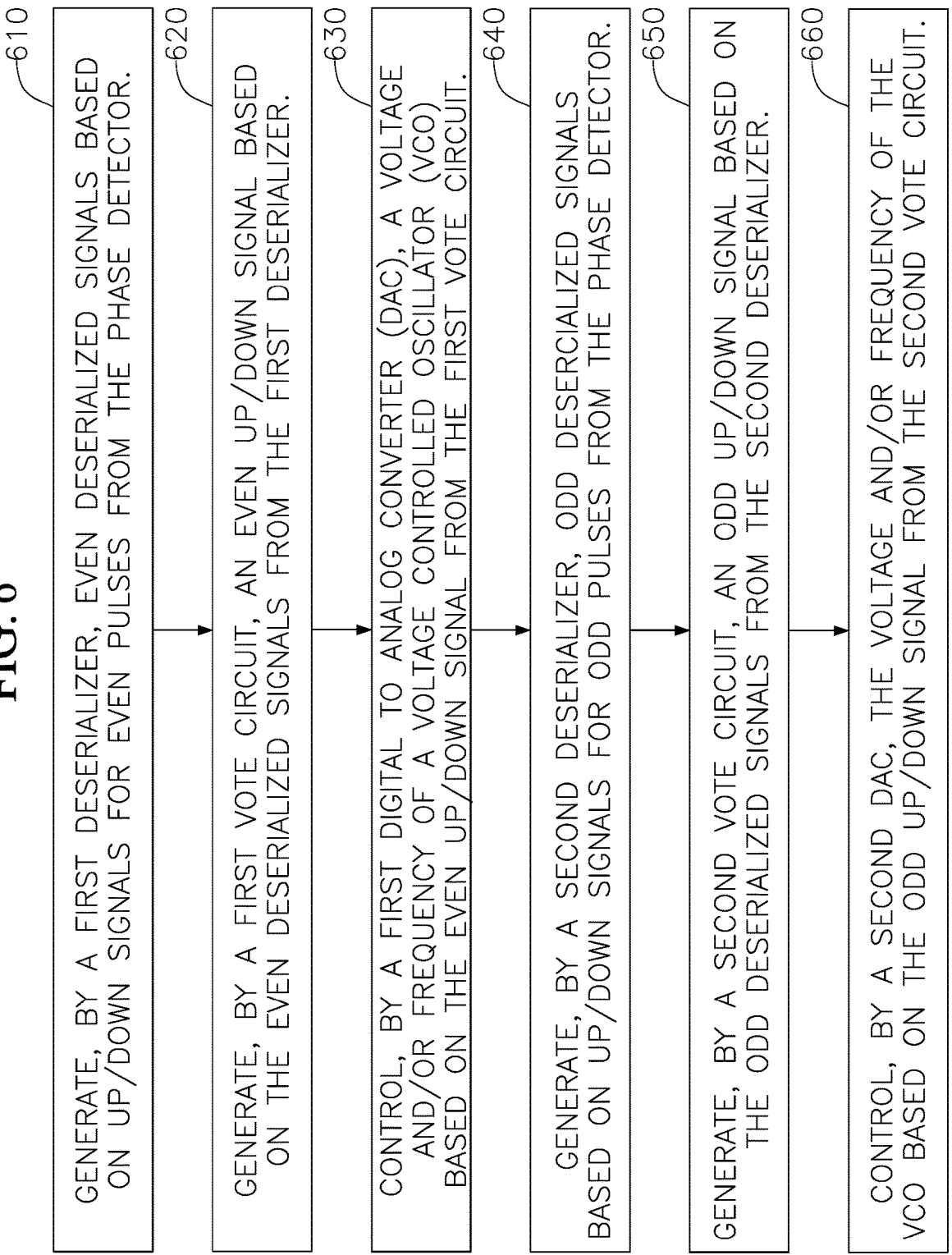

CLOCK DATA RECOVERY (CDR) WITH MULTIPLE PROPORTIONAL PATH CONTROLS

CROSS-REFERENCE TO RELATED APPLICATION(S)

This application claims priority to and the benefit of U.S. Provisional Patent Application No. 63/305,153 filed on Jan. 31, 2022, the entire content of which is incorporated by reference herein.

FIELD

The present application generally relates to clock data recovery (CDR) circuits, and more particularly to systems and methods for CDR with multiple proportional path controls.

BACKGROUND

High speed serial links, often referred to as serializer/deserializer (SerDes), are used extensively as interfaces in electronic devices such as electronic displays. As increasing amounts of data are transmitted over such high-speed serial links (e.g., as result of increased display resolution, color depth, and/or refresh rates), the interface speed increases accordingly as well. With the increase in speed comes an increase in power and silicon area of a communication receiver of the interface. Timing recovery, or clock and data recovery (CDR) is a critical function in such serial links to ensure proper transmission and receipt of data.

The above information in the Background section is only for enhancement of understanding of the background of the technology and therefore it should not be construed as admission of existence or relevancy of the prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a layered ready status reporting structure.

In one or more embodiments, a digital clock data recovery circuit including: a first vote circuit connected at an output of a first deserializer and configured to generate an even up/down signal based on even deserialized signals from the first deserializer; a first digital to analog converter (DAC) connected at an output of the first vote circuit and configured to control a voltage and/or frequency of a voltage controlled oscillator (VCO) based on the even up/down signal from the first vote circuit; a second vote circuit connected at an output of a second deserializer and configured to generate an odd up/down signal based on odd deserialized signals from the second deserializer; and a second DAC connected at an output of the second vote circuit and configured to control the voltage and/or frequency of the VCO based on the odd up/down signal from the second vote circuit.

In one or more embodiments, the first deserializer is configured to output the even deserialized signals based on up/down signals for even pulses from a phase detector; wherein the second deserializer is configured to output the odd deserialized signals based on up/down signals for odd pulses from the phase detector; and wherein the VCO is connected at a first output of the first DAC and a second output of the second DAC and configured to increase or decrease the voltage and/or frequency of the VCO based on the first output of the first DAC and the second output of the second DAC.

In one or more embodiments, the phase detector is configured to output the up/down signals for even pulses and the up/down signals for odd pulses based on incoming data from a crossing slicer connected at an input of the phase detector.

In one or more embodiments, the up/down signals for even pulses and the up/down signals for odd pulses from the phase detector are 2 UI wide pulses.

In one or more embodiments, the even deserialized signals from the first deserializer and the odd deserialized signals from the second deserializer are 8 UI wide pulses.

In one or more embodiments, the first deserializer is configured to convert the up/down signals for even pulses that are 2 UI wide to the even deserialized signals that are 8 UI wide and the second deserializer is configured to convert the up/down signals for odd pulses that are 2 UI wide to the odd deserialized signals that are 8 UI wide.

In one or more embodiments, the first vote circuit is configured to receive the 8 UI wide even deserialized signals or pulses including corresponding clock, data, and edge information and generate up votes and/or down votes for transitions in the even deserialized signals or pulses, and wherein the second vote circuit is configured to receive the 8 UI wide odd deserialized signals or pulses including corresponding clock, data, and edge information and generate up votes and/or down votes for transitions in the odd deserialized signals or pulses.

In one or more embodiments, the first vote circuit is configured to compare a sum of the up votes and a sum of the down votes for the transitions in the even deserialized signals or pulses and generate the even up/down signal based on a result of the comparison.

In one or more embodiments, the second vote circuit is configured to compare a sum of the up votes and a sum of the down votes for the for the transitions in the odd deserialized signals or pulses and generate the even up/down signal based on a result of the comparison.

In one or more embodiments, the digital clock data recovery circuit further including: a first dummy DAC configured to receive the even up/down signal from the first vote circuit; a second dummy DAC configured to receive the odd up/down signal from the second vote circuit; and an operational amplifier, wherein: a first input of the operational amplifier is responsive to the first output of the first DAC and the second output of the second DAC; and a second input of the operational amplifier is responsive to a first dummy output of the first dummy DAC, a second dummy output of the second dummy DAC, and an output of the operational amplifier.

In one or more embodiments, the first output of the first DAC and the second output of the second DAC are connected to the VCO. In one or more embodiments, at any time during an operation of the digital clock data recovery circuit, either the first DAC or the first dummy DAC is turned on and either the second DAC or the second dummy DAC is turned on.

In one or more embodiments, the first DAC, the second DAC, the first dummy DAC, and the second dummy DAC are 4-bit current DACs. In one or more embodiments, the digital clock data recovery circuit further including: a third deserializer configured to output third even deserialized signals based on the up/down signals for even pulses from the phase detector; a third vote circuit connected at an output of the third deserializer and configured to generate a third even up/down signal based on the third even deserialized signals; a third DAC connected at an output of the third vote circuit and configured to control a voltage of the VCO based on the third even up/down signal from the third vote circuit; a fourth deserializer configured to output fourth odd deserialized signals based on the up/down signals for odd pulses from the phase detector; a fourth vote circuit connected at an output of the fourth deserializer and configured to generate a fourth odd up/down signal based on the fourth odd deserialized signals; and a fourth DAC connected at an output of the fourth vote circuit and configured to control the voltage of the VCO based on the fourth odd up/down signal from the fourth vote circuit.

In one or more embodiments, a system including: a first vote circuit connected at an output of a first deserializer and configured to generate an even up/down signal based on even deserialized signals from the first deserializer; a first digital to analog converter (DAC) connected at an output of the first vote circuit and configured to control a voltage and/or frequency of a voltage controlled oscillator (VCO) based on the even up/down signal from the first vote circuit; a second vote circuit connected at an output of a second deserializer and configured to generate an odd up/down signal based on odd deserialized signals from the second deserializer; a second DAC connected at an output of the second vote circuit and configured to control the voltage and/or frequency of the VCO based on the odd up/down signal from the second vote circuit; a first dummy DAC configured to receive the even up/down signal from the first vote circuit; a second dummy DAC configured to receive the odd up/down signal from the second vote circuit; and an operational amplifier, wherein: a first input of the operational amplifier is connected to a first output of the first DAC and a second output of the second DAC; and a second input of the operational amplifier is responsive to a first dummy output of the first dummy DAC, a second dummy output of the second dummy DAC, and an output of the operational amplifier.

In one or more embodiments, the first deserializer is configured to output the even deserialized signals based on up/down signals for even pulses from a phase detector; wherein the second deserializer is configured to output the odd deserialized signals based on up/down signals for odd pulses from the phase detector; wherein the VCO is connected at the first output of the first DAC and the second output of the second DAC and configured to increase or decrease the voltage and/or frequency of the VCO based on the first output of the first DAC and the second output of the second DAC; and wherein the first output of the first DAC and the second output of the second DAC are connected to the VCO.

In one or more embodiments, the first deserializer is configured to convert the up/down signals for even pulses that are 2 UI wide to the even deserialized signals that are 8 UI wide and the second deserializer is configured to convert the up/down signals for odd pulses that are 2 UI wide to the odd deserialized signals that are 8 UI wide. In one or more embodiments, wherein the first vote circuit is configured to receive the 8 UI wide even deserialized signals or pulses including corresponding clock, data, and edge information and generate up votes and/or down votes for transitions in the even deserialized signals or pulses, and wherein the second vote circuit is configured to receive the 8 UI wide odd deserialized signals or pulses including corresponding clock, data, and edge information and generate up votes and/or down votes for transitions in the odd deserialized signals or pulses.

In one or more embodiments, the first vote circuit is configured to compare a sum of the up votes and a sum of the down votes for the transitions in the even deserialized signals or pulses and generate the even up/down signal based on a result of the comparison; and wherein the second vote circuit is configured to compare a sum of the up votes and a sum of the down votes for the for the transitions in the odd deserialized signals or pulses and generate the even up/down signal based on a result of the comparison. In one or more embodiments, a method for digital clock data recovery including: generating, by a first deserializer connected at an output of a phase detector, even deserialized signals based on up/down signals for even pulses from the phase detector; generating, by a first vote circuit connected at an output of the first deserializer, an even up/down signal based on the even deserialized signals from the first deserializer; controlling, by a first digital to analog converter (DAC) connected at an output of the first vote circuit, a voltage and/or frequency of a voltage controlled oscillator (VCO) based on the even up/down signal from the first vote circuit; generating, by a second deserializer connected at the output of the phase detector, odd deserialized signals based on up/down signals for odd pulses from the phase detector; generating, by a second vote circuit connected at an output of the second deserializer, an odd up/down signal based on the odd deserialized signals from the second deserializer; and controlling, by a second DAC connected at an output of the second vote circuit, the voltage and/or frequency of the VCO based on the odd up/down signal from the second vote circuit.

BRIEF DESCRIPTION OF THE DRAWINGS

These and other features of some example embodiments of the present disclosure will be appreciated and understood with reference to the specification, claims, and appended drawings, wherein:

FIG. 2A illustrates a proportional path of a CDR, according to one or more embodiments and FIG. 2B illustrates a waveform diagram of FIG. 2A, according to one or more embodiments.

FIG. 6 illustrates a flow chart illustrating a method for digital clock data recovery of an input data, according to one or more embodiments.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

Figure 1:
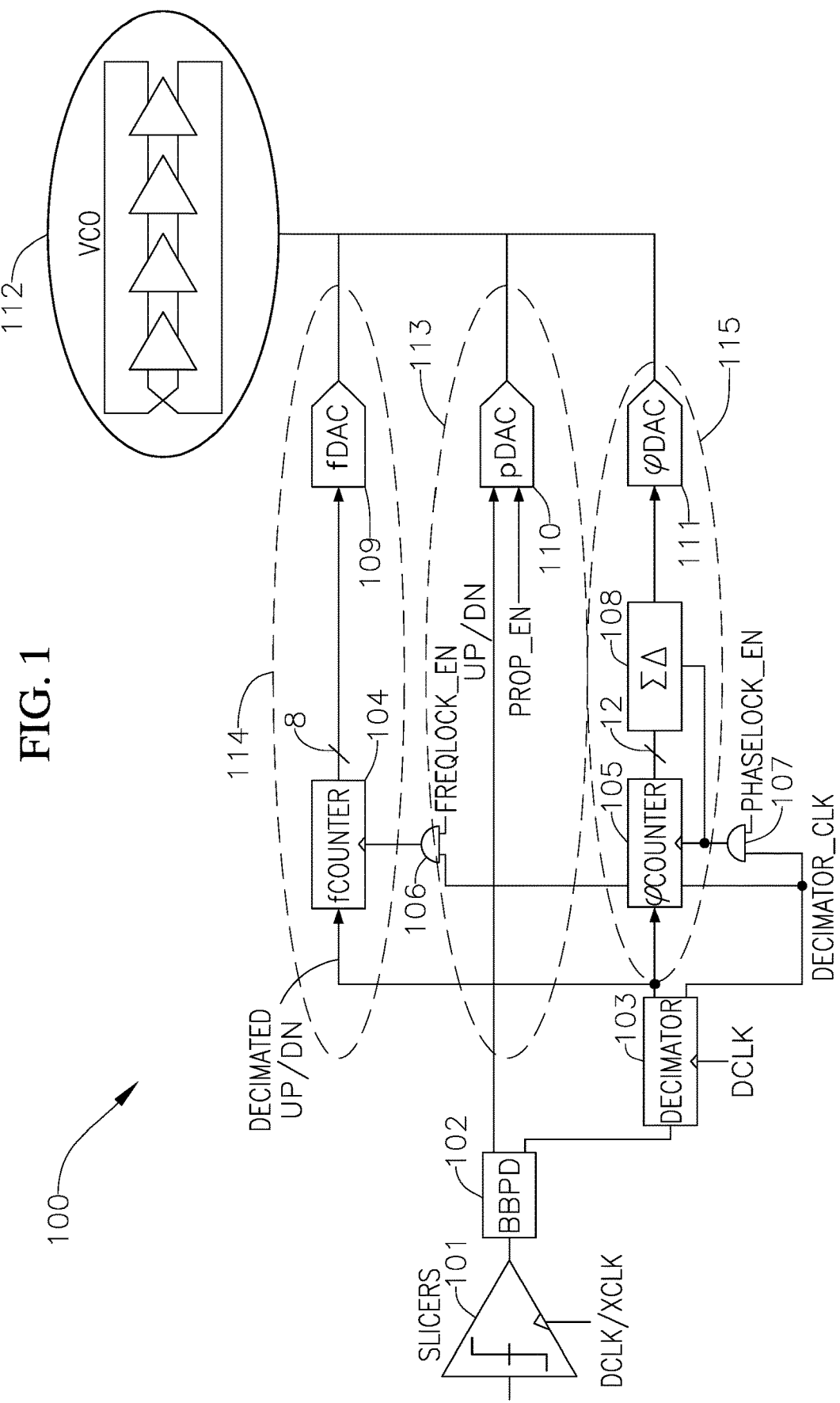
FIG. 1 illustrates a digital CDR system, according to one or more embodiments of the present disclosure.

The detailed description set forth below in connection with the appended drawings is intended as a description of some example embodiments of method and apparatus for a layered ready status reporting structure provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

In some embodiments, one or more outputs of the different embodiments of the methods and systems of the present disclosure may be transmitted to an electronics device coupled to or having a display device for displaying the one or more outputs or information regarding the one or more outputs of the different embodiments of the methods and systems of the present disclosure.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

High speed serial links, often referred to as serializer/deserializer (SerDes), are used extensively as interfaces in electronic devices such as electronic displays. As increasing amounts of data are transmitted over such high-speed serial links (e.g., as result of increased display resolution, color depth, and/or refresh rates), the interface speed increases accordingly as well. With the increase in speed comes an increase in power and silicon area of a communication receiver of the interface. Timing recovery, or clock and data recovery (CDR) is a critical function in such serial links to ensure proper transmission and receipt of data.

A CDR circuit is an integral part of a serial communication system. A CDR circuit, that generally resides at the receiver end of a serial link, may be configured to extract the clock embedded in the incoming serial random data stream, which may be used to produce synchronized clock and data signals at the receiver. The performance of the CDR may be critical to ensure and maintain desired accuracy of performance of the entire serial communication system. For example, the CDR circuit used in the receive portion of a SerDes may have a significant impact on the bit error rate (BER). Digital CDRs, where analog circuits of an analog CDR are replaced with equivalent digital circuit bocks, may be beneficial over analog CDRs. For example, a digital CDR that uses a digital loop filter, may eliminate the need for a large capacitor and therefore may be fully integrated. Further, digital CDRs may save power and area as well as reduce voltage and temperature (PVT) variation.

FIG. 1 illustrates a digital CDR system, according to one or more embodiments of the present disclosure.

The CDR 100 may include three paths: a proportional path 113, a frequency control path 114, and an integral path 115. The three paths (e.g., the proportional control path 113, the frequency control path 114, and the integral path 115) may provide respective control information to a voltage controlled oscillator (VCO).

For example, in CDR 100, a data and a crossing slicer 101 may sample the incoming data based on a data clock (dclk) and a crossing clock (xclk) received at the crossing slicer 101, and provide the data to the bang-bang phase detector (BBPD) 102. In one or more embodiments, the BBPD 102 may determine if the phase of the clock generated by the voltage controlled oscillator (VCO) 112 is in alignment (e.g., in-phase) with the incoming data based on dclk and/or xclk. A bang-ng phase detector has three states that include the phase being early, late, or that there is no useful information (e.g., there is no data transition required to determine phase alignment). Based on the current state, the BBPD 102 may output an up value or a down value. The up or down signal from the BBPD 102 is provided to the proportional path 113 and a decimator 103 connected to the frequency control path 114 and the integral path 115.

In one or more embodiments, a decimated up or down signal from the decimator 103 is provided to a frequency counter 104 and a phase counter 105 of the frequency control path 114 and the integral path 115, respectively. The up or down signal from the decimator 103 may be generated based on the up or down signal from the BBPD 102 and a dclk provided at the decimator 103.

In one or more embodiments, in case of the frequency control path 114, the output from the frequency counter 104 may be provided to a digital to analog converter (DAC) 109 that is connected to the VCO 112 that may influence in increasing or decreasing the control voltage of the VCO which in turn may increase or decrease the frequency of the clock generated from the VCO. The frequency counter 104 may generate the output based on the decimated up or down signal from the decimator 103 and an output signal from an AND gate 106, which produces its output based on a frequency lock enable (e.g., freqlock_en) signal and an output from the phase counter 105 that are applied at the input of the AND gate 106. The output from the frequency counter 104 may be provided to the DAC 109 that is connected to the VCO 112. The DAC 109 may influence in increasing or decreasing the frequency of the clock generated from the VCO.

In one or more embodiments, in case of the integral path 115, the phase counter 105 generates its output based on the decimated up or down signal from the decimator 103, a decimator clock (e.g., decimator_clk) signal from the decimator 103, and an output signal from an AND gate 107, which produces its output based on a phase lock enable (e.g., phaselock_en) signal and the decimator_clk signal from the decimator 103 that are applied at the input of the AND gate 107. The output from the phase counter 105 may be provided to a modulator 108. The modulator 108 may produce its output based on the output of the phase counter 105 and the output of the AND gate 107 that are applied at the input of the modulator 108. The output of the modulator 108 may be provided to a DAC 111 that is connected to the VCO 112. The DAC 111 may influence in adjusting the phase of the clock generated from the VCO 112.

In the embodiment of FIG. 1, in case of the proportional path 108, the up or down signal from the BBPD 102 is directly provided to a DAC 110 of the proportional path 113. In one or more embodiments, the DAC 110 connected to the VCO 112 may control an increase or a decrease the control voltage of the VCO 112. For example, the DAC 110 connected to the VCO 112 may control an increase or a decrease of the control voltage of the VCO 112 to increase or decrease the frequency of the clock generated by the VCO to match the clock frequency and the phase of the received data signal at the crossing slicer 101. For example, in one or more embodiments, when an up signal is received at the DAC 110 (or a charge pump), the DAC 110 may increase the control voltage of the VCO 112 and the frequency of the clock generated may be increased and the phase may be adjusted accordingly. Similarly, when a down signal is received at the DAC 110, the DAC 110 may decrease the control voltage of the VCO 112 and the frequency of the clock generated may be decreased and the phase may be adjusted accordingly. In one or more embodiments, the VCO 112 may be four stage current mode logic (CML) ring VCO.

In one or more embodiments, a proportional path (e.g., the proportional path 113 of FIG. 1) of a CDR may control most of the loop dynamics (e.g., CDR bandwidth, inter-symbol-interference (ISI) induced jitter, etc.). Latency of the proportional path may impact CDR stability, for example, CDR bandwidth may be lowered if the latency of the proportional path is high to preserve stability.

FIG. 2A illustrates a proportional path of a CDR, according to one or more embodiments and FIG. 2B illustrates a waveform diagram of FIG. 2A, according to one or more embodiments.

As illustrated in FIG. 2A, the proportional path 200 of a CDR includes a phase detector 210, a decimator 220, and a DAC 230. In one or more embodiments, the phase detector may be a BBPD (e.g., the BBPD 102 of FIG. 1 that receives the sampled incoming data from the crossing slicer 101).

For example, in one or more embodiments, the phase detector 210 may determine if the phase of the clock generated by a VCO (e.g., VCO 112 of FIG. 1) connected to an output of the DAC 230, is in alignment (e.g., in-phase) with the incoming data (e.g., an incoming data at a crossing slicer connected at an input of the phase detector 210) based on a clock signal (e.g., a clock signal (e.g., dclk/xclk) that is generated at a VCO and provided at the input of a slicer connected to the input of the phase detector 210). In one or more embodiments, the phase detector 210 has three states that include the phase being early, late, or that there is no useful information (e.g., there is no data transition required to determine phase alignment). Based on the current state, the phase detector 210 may output an up value or a down value. In one or more embodiments, when generating the up or the down signal, the phase detector 210 may divide each of the up and down signals into even and odd signals. For example, each of the up signal outputted from the phase detector 210 may be divided into an up even signal UP_E and an up odd signal UP_O. Similarly, each of the down signal outputted from the phase detector 210 may be divided into a down even signal DOWN_E and a down odd signal DOWN_O. The phase detector 210 may generate the up even signal UP_E, the up odd signal UP_O, the down even signal DOWN_E, and the down odd signal DOWN_O, using one or more logic circuits.

In one or more embodiments, the logic circuit in the phase detector 210 may be a half rate architecture that may be used in both rising and falling edges to sample data. In one or more embodiments, slicers may generate both odd and even data with transition data information by xclk and xclkb. Based on these data information, BBPD may generates either UP_O or DOWN_O and either UP_E or DOWN_E. In one or more embodiments, the "odd" and "even" may be two parallel paths. A half-rate clock signal clk may be used with one half of the front-end working off the rising edge of the clock signal clk and the other half working off the falling edge of the same clock signal clk. These two parallel paths are referred to as "even" and "odd".

The up even signal UP_E and the up odd signal UP_O, or the down even signal DOWN_E and the down odd signal DOWN_O are provided as input to the decimator 220. The decimator 220 may include at least two OR logic gates 221 and 222 to respectively generate up and down signals from the up even signal UP_E and the up odd signal UP_O, and the down even signal DOWN_E and an down odd signal DOWN_O. For example, in response to the phase detector 210 generating the up even signal UP_E and the up odd signal UP_O, the OR logic gate 221 may generate an up signal "UP" by performing "OR" operation on the up even signal UP_E and the up odd signal UP_O applied at the input of the OR logic gate 221. Similarly, in response to the phase detector 210 generating the down even signal DOWN_E and the down odd signal DOWN_O, the OR logic gate 222 may generate a down signal "DN" by performing "OR" operation on the down even signal DOWN_E and the down odd signal DOWN_O applied at the input of the OR logic gate 222.

The up or down signal generated from the decimator 220 is provided to the input of the DAC 230. This OR'ed UP/DN signal from the decimator 220 may directly control the DAC 230, which may in turn control a voltage (or frequency) at a VCO that is connected at the output of the DAC 230. For example, the DAC 230 connected to a VCO may control an increase or a decrease of the control voltage of the VCO to increase or decrease the frequency of the clock generated by the VCO to match the clock frequency of the received data signal at the phase detector 210. For example, when an up signal "UP" is received at the DAC 230, the DAC 230 may increase the control voltage of the VCO and the frequency of the clock generated may be increased. Similarly, when a down signal "DN" is received at the DAC 110, the DAC 110 may decrease the control voltage of the VCO 112 and the frequency of the clock generated may be decreased.

Referring to FIG. 2B, a clock signal "2 UI CLK", an up even signal UP_E, an up odd signal UP_O, and an "OR" ed up signal "UP" (e.g., generated by performing OR operation on UP_E and UP_O) are illustrated. In one or more embodiments, the source of the 2 UI clock may be the VCO 112. This clock may be applied to the slicers 101. There may be multiple phases of this clock (e.g., DCLK/XCLK) that are used in the slicer block. The phase detector (e.g., BBPD 102) also has digital retimers (e.g., flip-flops) that use a buffered/delayed version of DCLK/XCLK. For that matter, any clk in the entire receiver may be derived from the clocks coming out of the VCO.

The up even signal UP_E and the up odd signal UP_O of FIG. 2B may be the UP_E and UP_O signals generated from the phase detector 220 and applied at the input of the OR logic gate 221 of the decimator 220. The "OR" ed up signal "UP" of FIG. 2B may be the signal "UP" at the output of the OR logic gate 221 and generated by performing OR operation on the UP_E and UP_O signals by the OR logic gate 221. The clock signal 2 UI CLK may be applied to the phase detector 210. The up even signal UP_E and the up odd signal UP_O may have different phases.

After a pulse of the clock signal 2 UI CLK is generated, a pulse may appear in the up even signal UP_E. The up even signal UP_E may include pulses having a logic high level and a logic low level, and the pulses of the up even signal UP_E may be repeated at a first time interval. The up even signal UP_E pulses may have a duty cycle that is different from the duty cycle of clock signal 2 UI CLK.

The up odd signal UP_O pulse may be generated after the up even signal UP_E pulse is generated as the up even signal UP_E and the up odd signal UP_O may have different phases. The up odd signal UP_O pulse may transition from a logic low level to the logic high level in response to a falling edge of the up even signal UP_E pulse or when the up even signal UP_E pulse transitions from the logic high level to the logic low level. The up odd signal UP_O may include pulses having the logic high level and the logic low level, and the pulses of the up odd signal UP_O may be repeated at the first time interval. The up odd signal UP_O pulses may have a duty cycle that is the same as the duty cycle of the up even signal UP_E pulse.

The "OR" ed up signal "UP" of FIG. 2B that is outputted from the OR logic gate 221 may be generated at the same time as the up even signal UP_E pulse. For example, the up signal pulse may transition from the logic low level to the logic high level in response to a rising edge of the up even signal UP_E pulse or when the up even signal UP_E pulse transitions from the logic low level to the logic high level, and the UP signal pulse may transition from a logic high level to the logic low level in response to a falling edge of the up odd signal UP_O pulse or when the up odd signal UP_O pulse transitions from the logic high level to the logic low level.

However, using 2 UI pulse in CDR may have its challenges. For example, in low-end CMOS technologies, both analog and digital signals require longer settling times. When the 2 UI pulse is used in the CDR circuits in low-end CMOS technologies, due to the relatively short pulse width of 2 UI pulse, a relatively longer settling time required for the low-end CMOS technologies may not be achieved. In such a case, incomplete settling of the VCO frequency may result in lower effective frequency step leading to lower CDR acquisition range and pattern dependent proportional gain. For example, a long string of up/down signals from the phase detector of the CDR may result in a relatively larger frequency step, which may in turn lead to relatively lower pattern diffident proportional gain in the CDR.

In one or more embodiments, short UP/DN pulses may result in incomplete settling of the VCO (e.g., VCO 112). In one or more embodiments, it may be desirable for the VCO 112 to respond instantaneously to an UP/DN pulse. However, the technology node along with architecture may limit how quickly the VCO responds to an UP/DN pulse. In other words, in one or more embodiments, the VCO (and therefore the entire CDR) may respond differently to a 8 UI pulse versus 2 UI pulse. There could be a data pattern that may provide a pulse width of 8 UI versus another pattern that may provide a very short pulse (2 UI). In such a case, although the first scenario may generate the delta-frequency that the circuit is designed for, the latter scenario (e.g., 2 UI pulse) may not generate any delta frequency due to incomplete settling. This may result in different proportional gains dependent on the incoming pattern, which may not be desirable in a system.

Figure 3:
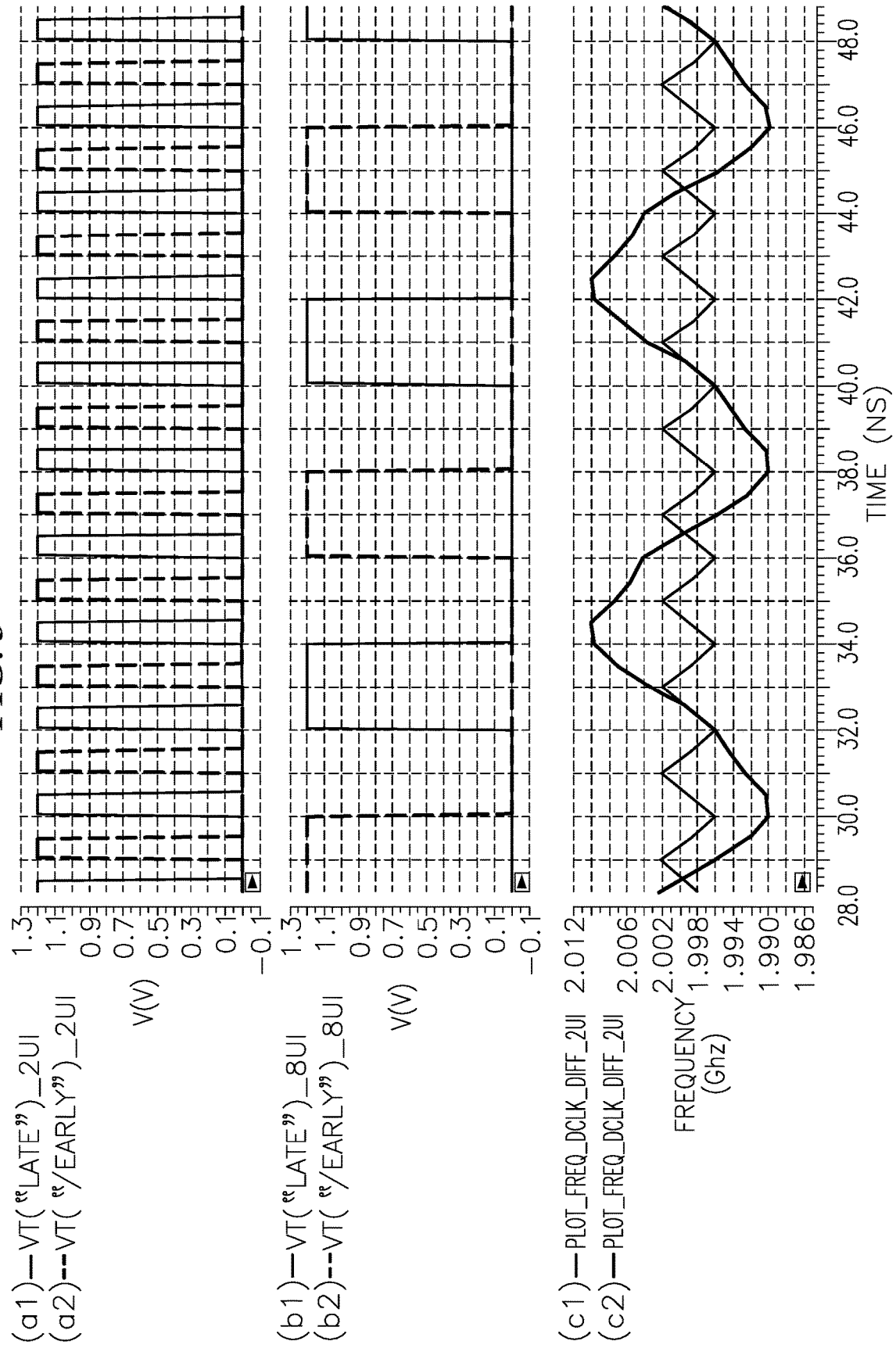
FIG. 3 illustrates 2 UI pulses, 8 UI pulses, and a voltage control oscillator (VCO) frequency waveforms when using a 2 UI pulse and a 8 UI pulse.

FIG. 3 illustrates 2 UI pulses, 8 UI pulses, and VCO frequency waveforms when using a 2 UI pulse and an 8 UI pulse.

For example, in (a1), (a2), (b1), (b2) of FIG. 3, the X-axis represents the time in ns and the Y-axis represents the voltage in V. However, in (c1) and (c2) of FIG. 3, the X-axis represents the time in ns and the Y-axis represents the frequency in GHz.

In FIG. 3, (a1) and (a2) represent two 2 UI pulses that have the same amplitude, pulse width, and period, however, the 2 UI pulse shown in (a2) of FIG. 3 is delayed in phase compared to the 2 UI pulse shown in (a1) of FIG. 3. Similarly, in FIG. 3, (b1) and (b2) represent two 8 UI pulses that have the same amplitude, pulse width, and period, however, the 8 UI pulse shown in (b2) of FIG. 3 is delayed in phase compared to the BUI pulse shown in (b1) of FIG. 3.

In FIG. 3, (c1) and (c2) illustrate a 2 UI frequency waveform and an 8 UI frequency waveform of the VCO, respectively. For example, (c1) in FIG. 3 may represent a frequency waveform from the VCO when 2 UI pulse is used and (c2) in FIG. 3 may represent a frequency waveform from the VCO when 8 UI pulse is used.

For example, as shown in (c1) and (c2) of FIG. 3, the 8 UI waveform has longer settling time compared to the 2 UI waveform. Therefore, in low-end CMOS technologies, where both analog and digital signals require longer settling times, 8 UI pulse may be desirable.

However, simply increasing the pulse width of the up/down signals from the phase detector (e.g., phase detector 210) may result in less robust proportional path control in a CDR circuit. For example, if only the pulse width of the up/down signals from the phase detector in a CDR circuit is increased to 8 UI, one up/down signal will result in the same CDR response as eight consecutive up/down signals. For example, a minimum of 8 UI wide pulse may be needed to get complete VCO settling. During this 8 UI period, there are 8 different UP/DN data points, where each UI results in an UP/DN result with four each in the "ODD" and "EVEN" halves. In other words, four UP/DN bits may be combined in some fashion to create a single wide UP/DN pulse. As such, there may be UP/DN data that is being dropped to create this single wide UP/DN pulse. Implementing this using a single OR gate may be the easiest but may not be the best way. An OR gate may mean anything from 1-4 UP/DN will result in a wide UP/DN pulse being generated. Instead, one or more embodiments of the present disclosure use a majority vote circuit that looks at the four UP/DN bits and only issues an UP/DN if the majority of those are high. In one or more embodiments, introducing a majority voting circuit in the proportional path of the DAC in addition of using an 8 UI pulse may result in a more robust DAC that may be desirable for low-end CMOS technologies.

Figure 4A:
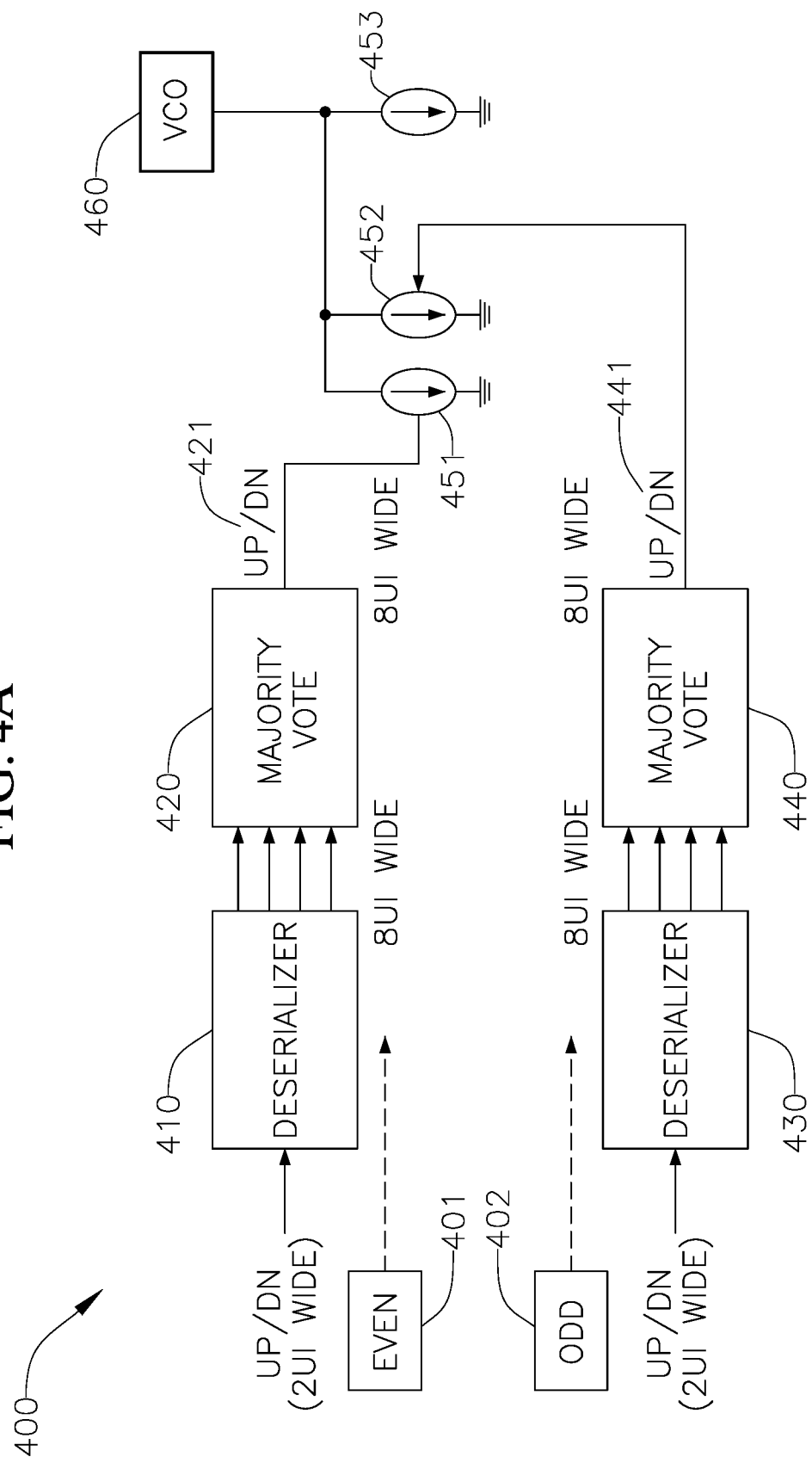
FIG. 4A illustrates proportional paths of a CDR, according to one or more embodiments.
Figure 4B:
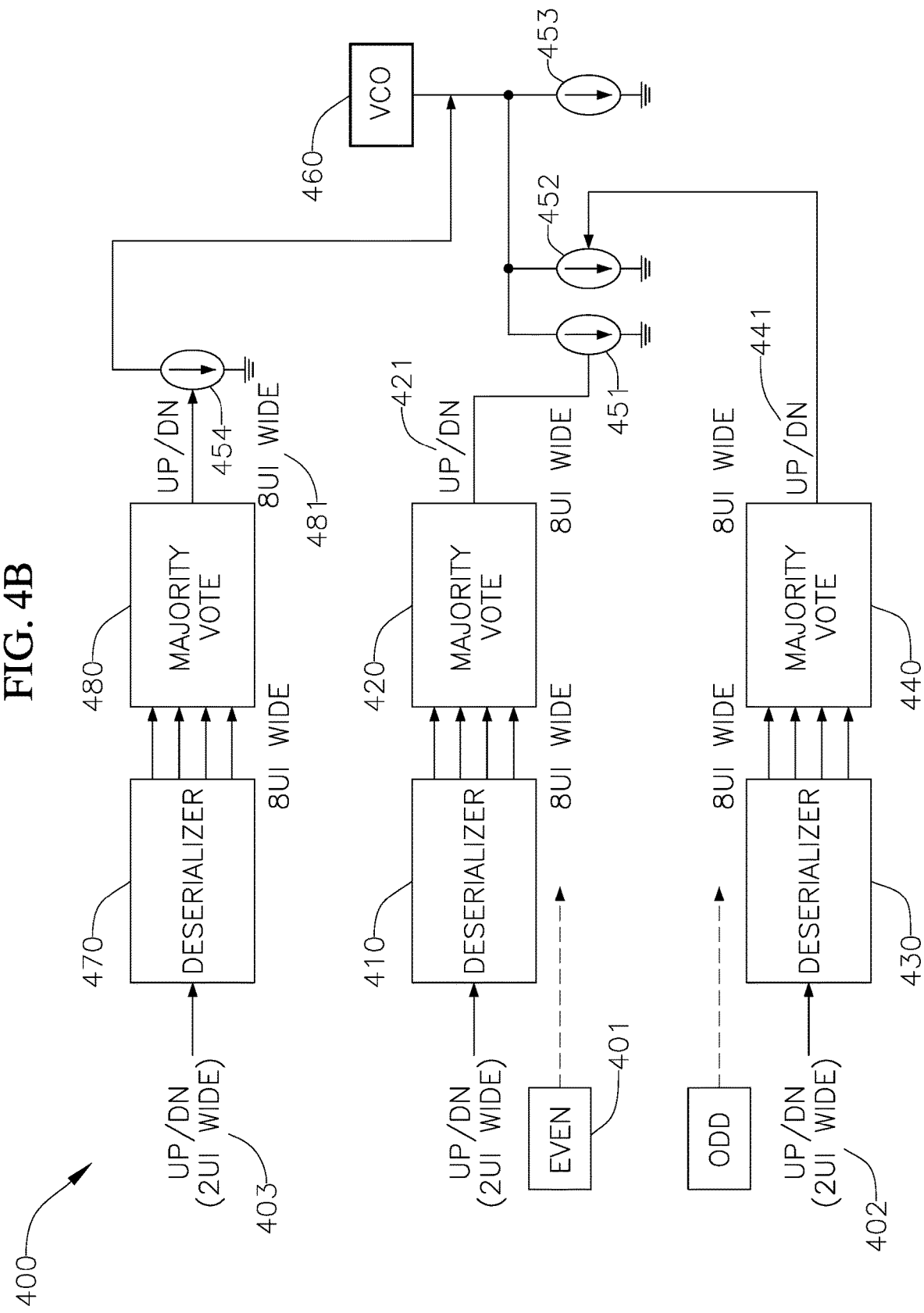
FIG. 4B illustrates another example of proportional paths of a CDR, according to one or more embodiments.

FIG. 4A illustrates proportional paths of a CDR, according to one or more embodiments. FIG. 4B illustrates another example of proportional paths of a CDR, according to one or more embodiments.

In the embodiment of FIG. 4A, the even and odd up/down signals "UP"/"DN" from a phase detector (e.g., the phase detector 210 in FIG. 2) may be separated out in even and odd proportional control paths 401 and 402 for increased proportional path control. For example, in the embodiment of FIG. 4A, separate 8 UI wide pulse may be used to create the up or down pulse going to each of the two current DACs 451 and 452 in the proportional paths 401 and 402, respectively. Additionally, majority voting may be implemented in each of the even and odd proportional control paths 401 and 402. For example, in the embodiment of FIG. 4A, the proportional path may include two identical current DACs 451 and 452 (e.g., 4-bit current DACs) for even and odd up/down pulses, respectively. Further, in the embodiment of FIG. 4, even and odd currents from the even and odd proportional paths 401 and 402 of the CDR may share a single unity gain amplifier (discussed with respect to FIG. 5), which may reduce or minimize an area penalty of using two op-amps for two separate proportional DACs (or charge pumps) in the two proportional control paths 401 and 402.

In the embodiment of FIG. 4A, 2 UI wide even and odd up/down signals "UP"/"DN" from a phase detector (e.g., phase detector 210) may be provided at the input of the deserializers 410 and 430.

For example, in one or more embodiments, a phase detector (e.g., phase detector 210 of FIG. 2A) may receive incoming data from the crossing slicer (e.g., crossing slicer 101 of FIG. 1). Based on the received data, the phase detector may determine if the phase of the clock generated by a VCO 460 connected to an output of the DACs 451 and 452 is in alignment (e.g., in-phase) with the incoming data based on a clock signal (e.g., a clock signal (e.g., DCLK/XCLK) that is generated at the VCO 460 and provided at the input of the slicer connected to the input of the phase detector). In one or more embodiments, the phase detector has three states that include the phase being early, late, or that there is no useful information (e.g., there is no data transition required to determine phase alignment). Based on the current state, the phase detector may output an up value or a down value. In one or more embodiments, when generating the up or the down signal, the phase detector may divide each of the up and down signals into even and odd signals. In one or more embodiments, the phase detector may generate the up even signal, the up odd signal, the down even signal, and an down odd signal using one or more logic circuits. The UP/DN signals or pulses generated from the phase detector may be 2 UI wide.

The 2 UI wide even up or down signals from the phase detector may be provided at the input of the deserializer 410 of the even proportional control path 401. Similarly, the 2 UI wide odd up or down signals from the phase detector may be provided at the input of the deserializer 430 of the odd proportional control path 402. The deserializers 410 and 430 may convert the 2 UI wide even and odd UP/DN signals or pulses to 8 UI wide even and odd UP/DN signals or pulses, respectively. The 8 UI wide even UP/DN signals or pulses from the deserializer 410 may be provided at the input of the majority vote circuit 420 and the 8 UI wide odd UP/DN signals or pulses from the deserializer 430 may be provided at the input of the majority vote circuit 440.

The majority vote circuits 420 and 440 may use a combination of received data from the respective deserializers 410 and 430 and the edge information (e.g., associated with clock signals (e.g., a clock signal (e.g., DCLK/XCLK)) to generate respective 8 UI UP/DN signals or pulses to be inputted at the DACs 451 and 452, respectively. For example, in one or more embodiments, the majority vote circuit 420 receives 8 UI wide even UP/DN signals or pulses including corresponding clock, data, and edge information that the vote is based on and creates up votes or down votes for each of the N bit transitions. The up/down votes are summed and compared and based on the result of the comparison, the majority vote circuit 420 may output either the 8 UI wide up or down even signal or pulse 421 to instruct the DAC 451 to increase or decrease the voltage (or frequency) of the VCO 460 to match the frequency of the input data at the slicer. Similarly, in one or more embodiments, the majority vote circuit 440 receives 8 UI wide odd UP/DN signals or pulses including corresponding clock, data, and edge information that the vote is based on and creates up votes and/or down votes for each of the N bit transitions. The up/down votes are summed and compared and based on the result of the comparison, the majority vote circuit 440 may output either the 8 UI wide up or down odd signal or pulse 441 to instruct the DAC 452 to increase or decrease the voltage (or frequency) of the VCO 460 to match the frequency of the input data at the slicer (e.g., crossing slicer 101).

In one or more embodiments, if the DAC 451 is to increase the VCO frequency based on the output from the majority vote 420 and the DAC 452 is to decrease the VCO frequency based on the output from the majority vote 440, that will cancel each other out because the delta-I is programmed to be identical for both DACs 451 and 452. Consequently, VCO 460 frequency will remain unchanged.

In the embodiment of FIG. 4A, the proposed proportional-path architecture 400, involving separate odd and even control paths 401 and 402, facilitates longer pulse widths in order to accommodate slower technology nodes (e.g., low-end CMOS technologies). Also, the separate odd and even paths 401 and 402 may enable finer control and may reduce effect of majority voting in a CDR circuit containing the proportional path architecture 400 leading to higher CDR bandwidths. In the embodiment of FIG. 4A, each of the current DACs 451 and 452 may be independently turned off to adjust overall proportional path gain (Kp) of the CDR circuit containing the proportional path architecture 400. Further, the proportional path architecture 400 of FIG. 4A may be extended to more than two proportional paths for even finer control allowing higher CDR bandwidths in slower technology nodes (e.g., low-end CMOS technologies).

For example, as shown in FIG. 4B, a third proportional path 403 may be introduced in the architecture of FIG. 4A. The proportional path 403 may be an even proportional path (e.g., 401) or an odd proportional path (e.g., 402). In one or more embodiments, the proportional path 403 may be divided into an even proportional path and an odd proportional path. However, the present disclosure is not limited thereto.

For example, in one or more embodiments, a 2 UI wide up or down signals from the phase detector may be provided at the input of the deserializer 470 of the proportional control path 403. The deserializer 470 may convert the 2 UI wide UP/DN signals or pulses to 8 UI wide UP/DN signals or pulses. The 8 UI wide UP/DN signals or pulses from the deserializer 470 may be provided at the input of the majority vote circuit 480. The majority vote circuit 480 may use a combination of received data from the deserializer 470 and the edge information (e.g., associated with clock signals (e.g., a clock signal (e.g., DCLK/XCLK)) to generate 8 UI UP/DN signals or pulses to be inputted at the DAC 454. For example, in one or more embodiments, the majority vote circuit 480 receives 8 UI wide UP/DN signals or pulses including corresponding clock, data, and edge information that the vote is based on and creates up votes or down votes for each of the N bit transitions. The up/down votes are summed and compared and based on the result of the comparison, the majority vote circuit 480 may output either the 8 UI wide up or down signal or pulse 481 to instruct the DAC 454 to increase or decrease the voltage (or frequency) of the VCO 460 to match the frequency of the input data at the slicer.

In one or more embodiments, a charge pump 453 may be connected between the output of the VCO 460 and the ground.

Figure 5:
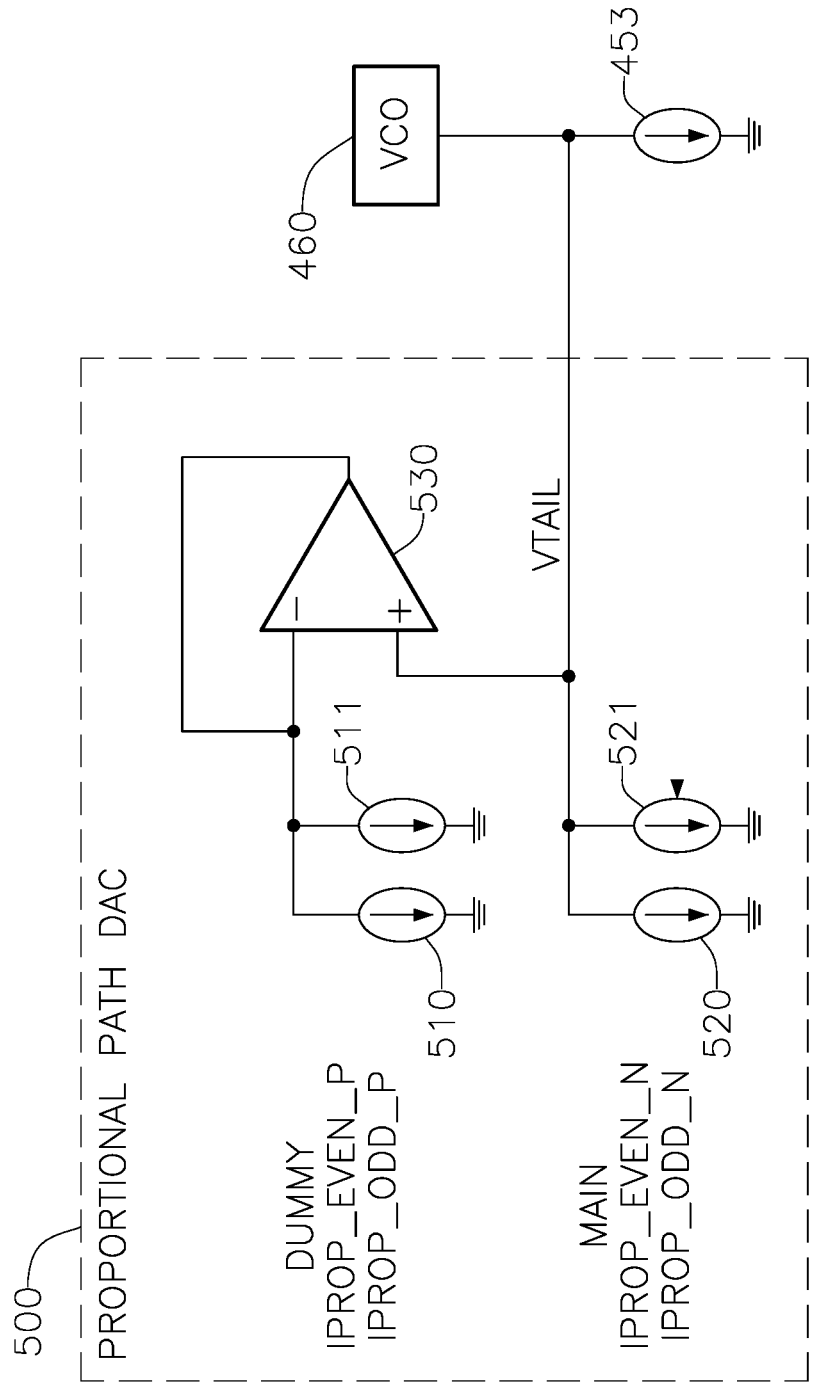
FIG. 5 illustrates a proportional path DAC architecture according to one or more embodiments.

FIG. 5 illustrates a proportional path DAC architecture according to one or more embodiments. The proportional path DAC architecture 500 may replace the DACs 451 and 452. In one or more embodiments, the proportional path DAC architecture 500 includes two main current DACs 520 and 521, the output of both of which are connected to a non-inverting input terminal of an op-amp 530. For example, in one or more embodiments, the 8 UI wide up or down even signal or pulse 421 from the majority vote circuit 420 may be provided at the input of the current DAC 520 and the 8 UI wide up or down odd signal or pulse 441 from the majority vote circuit 440 may be provided at the input of the current DAC 521. In one or more embodiments, the proportional path DAC architecture 500 also includes two dummy current DACs 510 and 511, the output of both of which are connected to an inverting input terminal of the op-amp 530 and also to the output terminal of the op-amp 530. The non-inverting input terminal of the op-amp 530 may be connected to the input of the VCO 460 and to another current DAC 420.

In one or more embodiments, the 8 UI wide up or down even signal or pulse 421 from the majority vote circuit 420 may be provided at the input of the dummy DAC 510 and the 8 UI wide up or down odd signal or pulse 441 from the majority vote circuit 440 may be provided at the input of the dummy DAC 511. In the proportional path DAC architecture 500 of FIG. 5, the up/dn pulses from the DACs to the VCO is implemented by switching current legs between "main" (e.g., DACs 520, 521) and "dummy" (e.g., DACs 510, 511) sides. For example, when the main DAC 520 is turned on, the dummy DAC 510 may be turned and vice versa. Similarly, when the main DAC 521 is turned on, the dummy DAC 511 maybe turned off and vice versa. Therefore, the main DSCs 520 and 521 and the dummy DACs 510 and 511 operate in sync.

In the architecture 500 of FIG. 5, the odd and even current DACs (e.g., main and dummy DACs) share the same op-amp 530. The op-amp 530 may be used to copy the tail voltage to the "dummy" (e.g., DACs 510, 511) side. In one or more embodiments, a 4-bit current DAC is employed in each of the even and odd paths. For example, in the embodiment of FIG. 5, each of the DACs 510, 511, 529, and 521 may be a 4-bit current DAC. This setting is used to adjust the proportional path gain of the CDR. For example, in one or more embodiments, the maximum setting for each of the DACs 510, 511, 520, 521 may be 15*Ilsb_odd and 15*Ilsb_even.

FIG. 6 illustrates a flowchart describing a method for digital clock data recovery of an input data, according to one or more embodiments.

For example, at 610, a first deserializer (e.g., the deserializer 410 of FIG. 4) connected at an output of a phase detector (e.g., the phase detector 210 of FIG. 2A) may generate even deserialized signals based on up/down signals for even pulses from the phase detector (e.g., the phase detector 210 of FIG. 2A).

For example, at 620, a first vote circuit (e.g., the majority vote circuit 420 of FIG. 4) connected at an output of the first deserializer (e.g., the deserializer 410 of FIG. 4) may generate an even up/down signal based on the even deserialized signals from the first deserializer (e.g., the deserializer 410 of FIG. 4).

For example, at 630, a first DAC (e.g., the DAC 451 of FIG. 4) connected at an output of the first vote circuit (e.g., the majority vote circuit 420 of FIG. 4) may control a voltage and/or frequency of a VCO (e.g., the VCO 460 of FIG. 4) based on the even up/down signal from the first vote circuit (e.g., the majority vote circuit 420 of FIG. 4).

For example, at 640, a second deserializer (e.g., the deserializer 430 of FIG. 4) connected at the output of the phase detector (e.g., the phase detector 210 of FIG. 2A) may generate odd deserialized signals based on up/down signals for odd pulses from the phase detector (e.g., the phase detector 210 of FIG. 2A).

For example, at 650, a second vote circuit (e.g., the majority vote circuit 440 of FIG. 4) connected at an output of the second deserializer (e.g., the deserializer 430 of FIG. 4) may generate an odd up/down signal based on the odd deserialized signals from the second deserializer (e.g., the deserializer 430 of FIG. 4).

For example, at 660, a second DAC (e.g., the DAC 452 of FIG. 4) connected at an output of the second vote circuit (e.g., the majority vote circuit 440 of FIG. 4) may control the voltage and/or frequency of the VCO (e.g., the VCO 460 of FIG. 4) based on the odd up/down signal from the second vote circuit (e.g., the majority vote circuit 440 of FIG. 4).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A digital clock data recovery circuit comprising:
   a first vote circuit connected at an output of a first deserializer and configured to generate an even up/down signal based on even deserialized signals from the first deserializer;
   a first digital to analog converter (DAC) connected at an output of the first vote circuit and configured to control a voltage and/or frequency of a voltage controlled oscillator (VCO) based on the even up/down signal from the first vote circuit;
   a second vote circuit connected at an output of a second deserializer and configured to generate an odd up/down signal based on odd deserialized signals from the second deserializer; and
   a second DAC connected at an output of the second vote circuit and configured to control the voltage and/or frequency of the VCO based on the odd up/down signal from the second vote circuit.

2. The digital clock data recovery circuit of claim 1, wherein the first deserializer is configured to output the even deserialized signals based on up/down signals for even pulses from a phase detector;
   wherein the second deserializer is configured to output the odd deserialized signals based on up/down signals for odd pulses from the phase detector; and
   wherein the VCO is connected at a first output of the first DAC and a second output of the second DAC and configured to increase or decrease the voltage and/or frequency of the VCO based on the first output of the first DAC and the second output of the second DAC.

3. The digital clock data recovery circuit of claim 2, wherein the phase detector is configured to output the up/down signals for even pulses and the up/down signals for odd pulses based on incoming data from a crossing slicer connected at an input of the phase detector.

4. The digital clock data recovery circuit of claim 2, wherein the up/down signals for even pulses and the up/down signals for odd pulses from the phase detector are 2 UI wide pulses.

5. The digital clock data recovery circuit of claim 2, wherein the even deserialized signals from the first deserializer and the odd deserialized signals from the second deserializer are 8 UI wide pulses.

6. The digital clock data recovery circuit of claim 2, wherein the first deserializer is configured to convert the up/down signals for even pulses that are 2 UI wide to the even deserialized signals that are 8 UI wide and the second deserializer is configured to convert the up/down signals for odd pulses that are 2 UI wide to the odd deserialized signals that are 8 UI wide.

7. The digital clock data recovery circuit of claim 6, wherein the first vote circuit is configured to receive the 8 UI wide even deserialized signals or pulses comprising corresponding clock, data, and edge information and generate up votes and/or down votes for transitions in the even deserialized signals or pulses, and
   wherein the second vote circuit is configured to receive the 8 UI wide odd deserialized signals or pulses comprising corresponding clock, data, and edge information and generate up votes and/or down votes for transitions in the odd deserialized signals or pulses.

8. The digital clock data recovery circuit of claim 7, wherein the first vote circuit is configured to compare a sum of the up votes and a sum of the down votes for the transitions in the even deserialized signals or pulses and generate the even up/down signal based on a result of the comparison.

9. The digital clock data recovery circuit of claim 7, wherein the second vote circuit is configured to compare a sum of the up votes and a sum of the down votes for the for the transitions in the odd deserialized signals or pulses and generate the even up/down signal based on a result of the comparison.

10. The digital clock data recovery circuit of claim 2, further comprising:
a first dummy DAC configured to receive the even up/down signal from the first vote circuit;
a second dummy DAC configured to receive the odd up/down signal from the second vote circuit; and
an operational amplifier, wherein:
a first input of the operational amplifier is responsive to the first output of the first DAC and the second output of the second DAC; and
a second input of the operational amplifier is responsive to a first dummy output of the first dummy DAC, a second dummy output of the second dummy DAC, and an output of the operational amplifier.

11. The digital clock data recovery circuit of claim 10, wherein the first output of the first DAC and the second output of the second DAC are connected to the VCO.

12. The digital clock data recovery circuit of claim 11, wherein at any time during an operation of the digital clock data recovery circuit, either the first DAC or the first dummy DAC is turned on and either the second DAC or the second dummy DAC is turned on.

13. The digital clock data recovery circuit of claim 10, wherein the first DAC, the second DAC, the first dummy DAC, and the second dummy DAC are 4-bit current DACs.

14. The digital clock data recovery circuit of claim 2, further comprising:
a third deserializer configured to output third even deserialized signals based on the up/down signals for even pulses from the phase detector;
a third vote circuit connected at an output of the third deserializer and configured to generate a third even up/down signal based on the third even deserialized signals;
a third DAC connected at an output of the third vote circuit and configured to control a voltage of the VCO based on the third even up/down signal from the third vote circuit;
a fourth deserializer configured to output fourth odd deserialized signals based on the up/down signals for odd pulses from the phase detector;
a fourth vote circuit connected at an output of the fourth deserializer and configured to generate a fourth odd up/down signal based on the fourth odd deserialized signals; and
a fourth DAC connected at an output of the fourth vote circuit and configured to control the voltage of the VCO based on the fourth odd up/down signal from the fourth vote circuit.

15. A system comprising:
a first vote circuit connected at an output of a first deserializer and configured to generate an even up/down signal based on even deserialized signals from the first deserializer;
a first digital to analog converter (DAC) connected at an output of the first vote circuit and configured to control a voltage and/or frequency of a voltage controlled oscillator (VCO) based on the even up/down signal from the first vote circuit;
a second vote circuit connected at an output of a second deserializer and configured to generate an odd up/down signal based on odd deserialized signals from the second deserializer;
a second DAC connected at an output of the second vote circuit and configured to control the voltage and/or frequency of the VCO based on the odd up/down signal from the second vote circuit;
a first dummy DAC configured to receive the even up/down signal from the first vote circuit;
a second dummy DAC configured to receive the odd up/down signal from the second vote circuit; and
an operational amplifier, wherein:
a first input of the operational amplifier is connected to a first output of the first DAC and a second output of the second DAC; and
a second input of the operational amplifier is responsive to a first dummy output of the first dummy DAC, a second dummy output of the second dummy DAC, and an output of the operational amplifier.

16. The system of claim 15, wherein the first deserializer is configured to output the even deserialized signals based on up/down signals for even pulses from a phase detector;
wherein the second deserializer is configured to output the odd deserialized signals based on up/down signals for odd pulses from the phase detector;
wherein the VCO is connected at the first output of the first DAC and the second output of the second DAC and configured to increase or decrease the voltage and/or frequency of the VCO based on the first output of the first DAC and the second output of the second DAC; and
wherein the first output of the first DAC and the second output of the second DAC are connected to the VCO.

17. The system of claim 16, wherein the first deserializer is configured to convert the up/down signals for even pulses that are 2 UI wide to the even deserialized signals that are 8 UI wide and the second deserializer is configured to convert the up/down signals for odd pulses that are 2 UI wide to the odd deserialized signals that are 8 UI wide.

18. The system of claim 17, wherein the first vote circuit is configured to receive the 8 UI wide even deserialized signals or pulses comprising corresponding clock, data, and edge information and generate up votes and/or down votes for transitions in the even deserialized signals or pulses, and
wherein the second vote circuit is configured to receive the 8 UI wide odd deserialized signals or pulses comprising corresponding clock, data, and edge information and generate up votes and/or down votes for transitions in the odd deserialized signals or pulses.

19. The system of claim 18, wherein the first vote circuit is configured to compare a sum of the up votes and a sum of the down votes for the transitions in the even deserialized signals or pulses and generate the even up/down signal based on a result of the comparison; and
wherein the second vote circuit is configured to compare a sum of the up votes and a sum of the down votes for the for the transitions in the odd deserialized signals or pulses and generate the even up/down signal based on a result of the comparison.

20. A method for digital clock data recovery comprising:
generating, by a first deserializer connected at an output of a phase detector, even deserialized signals based on up/down signals for even pulses from the phase detector;
generating, by a first vote circuit connected at an output of the first deserializer, an even up/down signal based on the even deserialized signals from the first deserializer;
controlling, by a first digital to analog converter (DAC) connected at an output of the first vote circuit, a voltage and/or frequency of a voltage controlled oscillator (VCO) based on the even up/down signal from the first vote circuit;

generating, by a second deserializer connected at the output of the phase detector, odd deserialized signals based on up/down signals for odd pulses from the phase detector;

generating, by a second vote circuit connected at an output of the second deserializer, an odd up/down signal based on the odd deserialized signals from the second deserializer; and controlling, by a second DAC connected at an output of the second vote circuit, the voltage and/or frequency of the VCO based on the odd up/down signal from the second vote circuit.

* * * * *